INTEGRAL HEAT SINK FOR SEMICONDUCTOR DEVICES

Filed May 15, 1967 2 Sheets-Sheet 1

United States Patent Office 3,457,988

Patented July 29, 1969

3,457,988

INTEGRAL HEAT SINK FOR SEMICONDUCTOR DEVICES

Alfred Meyerhoff, Greensburg, William A. Stewart, Pittsburgh, Arthur H. Long, Jeannette, and Richard E. Kothmann, Pittsburgh, Pa., assignors to Westinghouse Electric Corporation, Pittsburgh, Pa., a corporation of Pennsylvania Filed May 15, 1967, Ser. No. 638,510

Int. Cl. F28f *7/00*

U.S. Cl. 165—80 5 Claims

ABSTRACT OF THE DISCLOSURE

This invention provides a more efficient way for dissipating the heat produced by a heat generating component. The component is mounted at an optimum depth within a heat sink. Heat dissipating fin members are mounted, spaced apart from each other, on the heat sink. The fin members each have an integral collar for interference fit mounting of the fin on the heat sink. Preferably, each fin has a plurality of spoilers and apertures to break up the laminar flow of a cooling fluid circulating in and about the fins thereby creating a turbulent flow of the fluid to increase the efficiency of the heat dissipating fin members.

BACKGROUND OF THE INVENTION

Field of invention

This invention relates generally to apparatus for the removal of heat from an electronic component. Particularly, this invention relates to a method for fabricating a heat exchanger integral with a semiconductor housing.

Description of the prior art

The efficient removal of heat is one of the limiting factors in achieving the optimum current carrying capability of high power semiconductor devices. In one prior art device taught by T. C. New et al. in U.S. Patent 3,277,957, the semiconductor element of the device is mounted on the top surface of the heat sink member. The cooling fins of the device are separated from each other by individual spacer members and the fins themselves are void of any spoilers or deflection tabs except for some holes to facilitate mounting the device within a cooling fluid duct.

SUMMARY OF THE INVENTION

In accordance with the present invention there is provided apparatus for heat removal from a heat generating component comprising a first member having a first surface containing a recess therein for mounting a heat generating component within the recess and a second surface extending in a generally perpendicular direction with respect to the first surface; and a plurality of fins for heat dissipation disposed around the first member, the fins and the first member being of ductile and thermally conductive material with an interference fit between each fin and the first member.

An object of this invention is to provide a heat sink member for a semiconductor device which dissipates heat generated by an operating semiconductor element more efficiently than prior art heat sink members.

Another object of this invention is to provide a heat sink member for a semiconductor device in which a semiconductor element of the device is disposed within a recess in the heat sink member.

Another object of this invention is to provide a heat sink member for a semiconductor device in which a semiconductor element of the device is disposed within a recess in the heat sink member and cooling fins attached to the heat sink member have spoiling devices to create turbulence and to give direction to a cooling fluid caused to circulate about the cooling fins and the heat sink member.

Other objects of this invention will, in part, be obvious and will, in part, appear hereinafter.

DESCRIPTION OF THE DRAWINGS

For a better understanding of the nature and objects of the present invention, reference should be had to the following drawings, in which.

DESCRIPTION OF THE INVENTION

Figure 1:
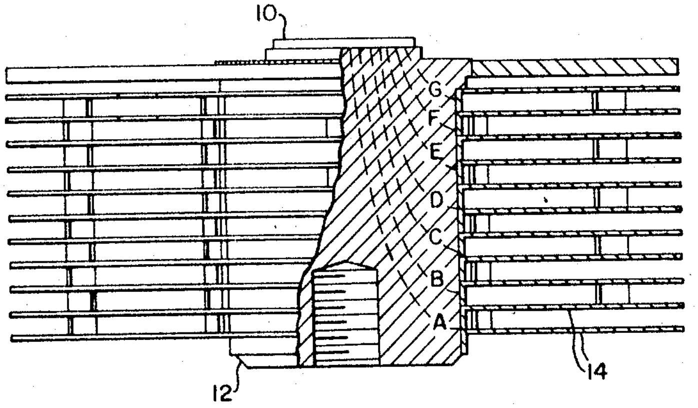
FIGURE 1 is a cross-sectional view of a heat sink member showing the flow of heat flux lines away from a heat source mounted on one surface of the member.

With reference to FIG. 1 there is shown a semiconductor element 10 mounted on a heat sink member 12 embodying the principles of heat dissipation for prior art semiconductor properties. Cooling of the member 12 by conventional air and gas circulation about the peripheral sides and edges of the member 12 causes the distribution of the heat flux lines A, B, C, D, E, F and G as shown. To dissipate the heat as quickly as possible a plurality of cooling fins 14 are mounted on the member 12.

To improve the dissipation of the heat from an operating semiconductor element it has been discovered that mounting a semiconductor element in a recess within the heat sink member 12 is very desirable.

Figure 2:
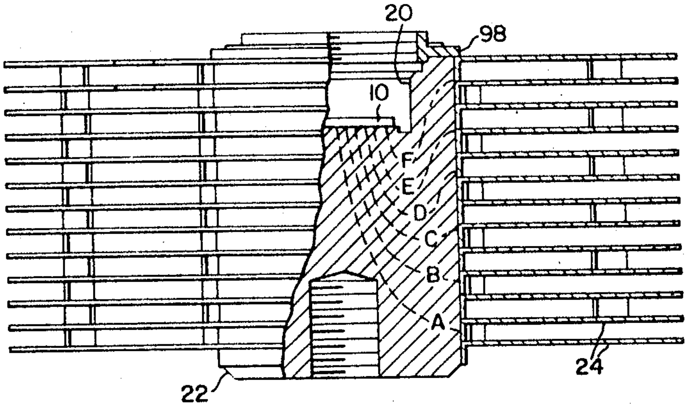
FIG. 2 is a cross-sectional view of a heat sink member embodying the teachings of this invention and showing the flow of heat flow lines away from a heat source mounted on the bottom of a recess in the member.

In FIG. 2, the semiconductor element 10 is mounted in a recess 20 of a heat sink member 22. To aid in the dissipating of heat, a plurality of cooling fins 24 are mounted on the member 22. Cooling of the member 22 by conventional air and gas circulation about the peripheral sides and edges of the member 22 causes the distribution of the heat flux lines A, B, C, D, E, and F as shown.

The heat sink member 22 comprises a suitable electrically and thermally conductive material such, for example, as copper, copper alloys, aluminum, aluminum alloys, iron and iron alloys.

The depth of the recess 20 is determined by mathematical analysis and calculations. Among the factors which are considered for determining the depth of the recess 20 are the thermal conductivity of the material comprising the heat sink member 22, the spacing of the fin 24 from each other, the thickness of the fin 24, the surface area of the fins 24, the thermal conductivity of the material comprising the fins 24, the diameter of the member 22, which is a function of the diameter of the element 10, and the length of the member 22, which is a function of the anticipated heat dissipation of the element 10. Therefore to more fully explain the invention, and for no other reason, the element 10 will be described as having an operating current of 300 amperes and a diameter of approximately $1\frac{5}{16}$ inch. The heat sink member 22, for purposes of illustration only, is comprised of copper containing about 0.5% tellurium and is 1⅞ inches in diameter and 2½ inches in length. Employing these factors the optimum depth of the recess 20 is approximately 0.50 inch.

Figure 3:
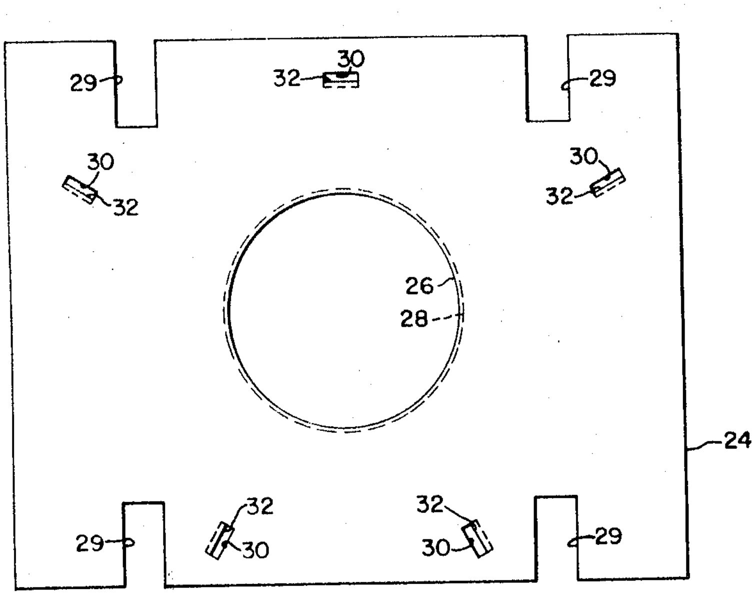
FIG. 3 is a planar view of a cooling fin.

With reference to FIG.3 there is shown a preferred form of the cooling fin 24. The material comprising the cooling fins 24 is ductile and thermally conductive. Preferably copper or a copper alloy, although materials such, for example, as aluminum and aluminum alloys are also suitable, is the material commonly employed in making the fins 24. Each fin 24 has a centrally disposed aperture 26 which encompasses the outer periphery of the heat sink member 22 upon which the fin 24 is mounted. The aperture 26 may be formed by punching, stamping or extruding in a manner which leaves a collar 28 which may serve as an integral spacer to maintain the cooling fins 24 at a predetermined distance from each other. Preferably, the first two fins have notches 29 to aid in securing the completed assembly to a panel or wall of an air duct and the like.

A plurality of apertures 30 are formed by displacing portions of the fin 24 and forming the displaced members into tabs, or spoilers, 32. The tabs 32 act as spoilers to break up the laminar flow of coolant fluid passing in between and about the fins 24 and the heat sink member 22. The spoilers 32 direct the flow of coolant fluid towards the member 22 thereby enabling a greater volume of coolant fluid to contact the member 22 than if no spoilers are employed. Additionally, the tabs 32 create a turbulence in the fluid flow. Some of the coolant fluid also passes through the apertures 32 from between one pair of adjacent fins 24 to between the next adjacent pair of cooling fins 24 where it creates additional turbulence in the coolant fluid flowing in and about the portion of the member 22 and the fins 24 located there.

The turbulence created by the spoilers 32 and the apertures 30 minimizes the thickness of the stagnant film layer which is always formed between the heat sink member 22 and the coolant fluid as well as on the surface of the fins 24. The thinner the stagnant film layer, the more efficient the transfer of heat to the coolant fluid from the member 22 and the fins 24.

A further feature of the spoilers 32 is to have them function as a spacer, cooperating with the collar 28 of the aperture 26, and thereby assuming uniform spacing between the cooling fins 24. In the design of the fins 24 shown with three spoilers 32 on one side of the center line and two spoilers 32 on the other side of the center line, the fins 24 are mounted on the heat sink member 22 by arranging the spoilers 32 asymmetrically. This mounting arrangement avoids sound vibration encountered when apertures 30 are vertically aligned with respect to each other.

The cooling fins 24 do not require the spoilers 32 or the apertures 30. However, to increase the efficiency of the fins 24 to dissipate a large quantity of heat, it has been found advantageous to include both the spoilers 32 and the apertures 30.

Figure 4:
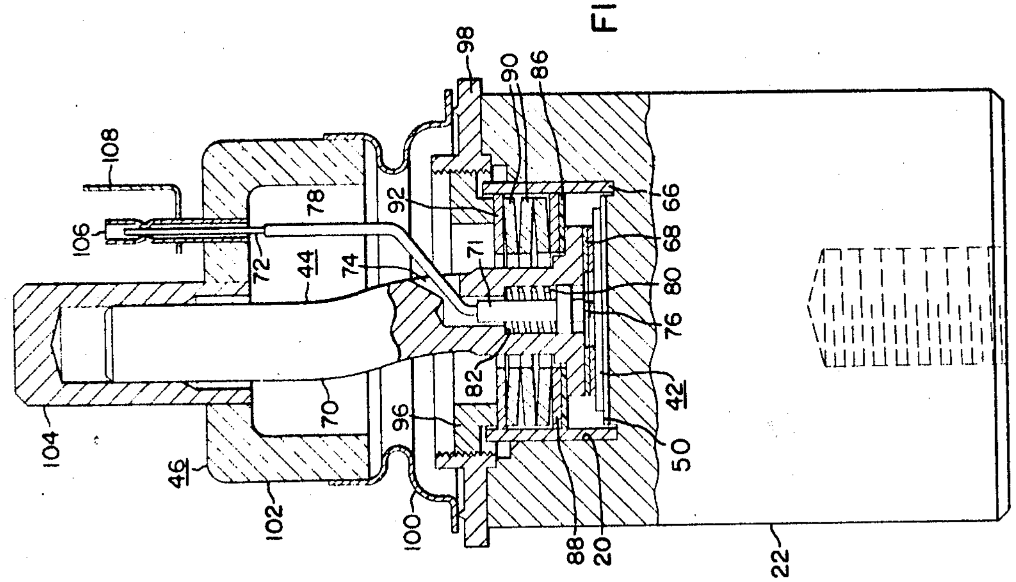
FIG. 4 is a view, partly in cross-section, of a portion of an electrical device made in accordance with the teachings of this invention.

With reference to FIG. 4 there is shown a portion of a compression bonded electrical device 40 (FIG. 6) embodying the heat sink member 22.

The portion of the compression bonded electrical device comprises a semiconductor assembly 42, the heat sink member 22, and an electrical contact assembly 44 and a header assembly 46.

Figure 5:
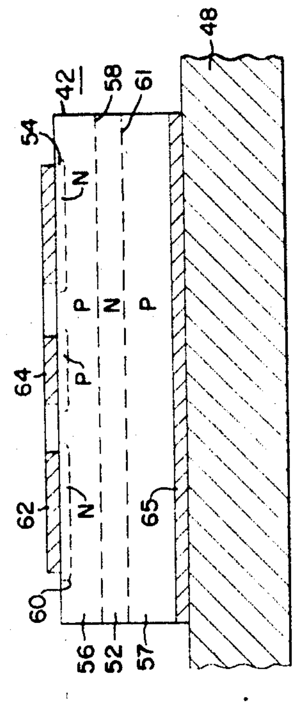
FIG. 5 is a cross-section view of a semiconductor element assembly.

Referring to FIGS. 4 and 5 the semiconductor assembly 42 comprises the semiconductor element 10, an electrical contact 48 and a layer 50 of a malleable electrically and thermally conductive metal.

The semiconductor element 10 comprises a body of a semiconductor material selected from the group consisting of silicon, silicon carbide, germanium, compounds of Group III and Group V elements, and compounds of Group II and Group VI elements. The element 10 has two regions 52 and 54 of a first type semiconductivity and two regions 56 and 57 of a second type semiconductivity, a p-n junction 58 between regions 52 and 56, a p-n junction 60 between regions 54 and 56, and a p-n junction 61 between regions 52 and 56.

An annular electrical contact 62 is disposed on the surface of the element 10 in an electrically conductive relationship with the region 54 of first type semiconductivity. A button type electrical contact 64 is centrally disposed on the same surface of the element 10 as the contact 62 and is in an electrically conductive relationship with the region 56 of second type semiconductivity.

The element 10 is joined to the electrical contact 48 with a suitable solder layer 65 comprising such, for example, as aluminum or a silver-lead-antimony solder alloy.

The electrical contact 48 has a thermal expansion characteristic closely matched to the semiconductor element 10. The contact 48 also is a firm support for the element 10. The contact 48 comprises a metal selected from the group consisting of molybdenum, tungsten, tantalum and base alloys thereof.

Referring again to FIG. 4 a metal sleeve 66 comprising such, for example, as steel is disposed within the recess of the member 22. The semiconductor assembly 42 is disposed within the sleeve 66 in the recess 20 in a manner such that when under compressive forces the element 10 will be in a good electrical and thermal conductivity relationship with the heat sink member 22.

The multiple contact assembly 44 is then mounted on the semiconductor assembly 42 within the sleeve 66. The multiple contact assembly 44 comprises a molybdenum washer 68 brazed to a partially hollow electrical connector 70 extending upwardly from the washer. An electrically insulating plug 71 is slidably mounted inside the hollow portion of the connector 70.

A first electrical lead 72 extends through a slot 74 in the side wall of the partially hollow connector 70 and down through the center of the hollowed out portion terminating in a button-shaped contact member 76. A layer 78 of electrical insulation is disposed about the lead 72 and the lower end of the insulation layer 78 is enclosed within the plug 71.

A force is maintained on the button-shaped contact member 76 by means of a coil spring 80 which is positioned within the connector 70. The spring 80 is maintained in compression by a shoulder 82 within the connector 70. The spring 82 maintains a constant force of from not less than two pounds on the button-shaped contact member 76 when it is in contact with the contact 64.

When a force is applied to the contact assembly 44, the washer 68 is forced into electrical contact with the electrical contact 62.

Upon application of the force, the contact 76 at the end of the lead 72 and the electrical contact 64 of the semi-conductor assembly 42 are also electrically connected. The contact 76 forces the plug 71 to slide upwardly within the hollow connector 70 thereby compressing the spring 80. The spring 80 provides a positive means for maintaining the electrical connection between the contacts 76 and 64.

An electrical insulating washer 86 is placed over the hollow connector 70 of the contact assembly 44 and disposed on top of the washer 68. A first metal thrust washer 88 is disposed on top of the insulating washer 86. At least one convex spring washer 90 is placed over the hollow connector 70 and disposed on the thrust washer 88. A second metal thrust washer 92 is placed over the hollow connector 70 and disposed on the spring washer 90.

A predetermined force is applied to the second metal thrust washer 92 to resiliently urge the multiple contact assembly 44, the semiconductor assembly 42 and the bottom of the recess 20 into an electrical and thermal conductive relationship. While maintaining the predetermined force application, an externally threaded apertured plug 96 is placed over the partially hollow connector 70 and screwed down into the weld ring 98 mounted in the member 22 to retain the desired predetermined force.

The header assembly 46 comprises a weld flange 100, ceramic side walls 102, a metal cup shaped member 104, a metallic tube 106 and an electrically connecting tab 108. The header 46 is joined to the weld ring 98.

The lead 72 passes upwardly through the metallic tube 106. The metallic tube 106 is then sealed to provide a hermetic seal for all the components within the header 46.

The cup-shaped member 104 is crimped about the upper portion of the partially hollow connector 70 to provide an electrical connecting means between a portion of the contact assembly 44 and an electrical circuit external to the device 40.

Figure 6:
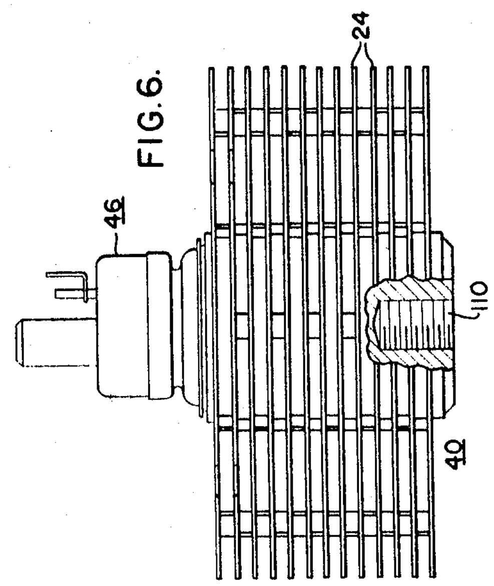
FIG. 6 is a view, partly in cross-section of an electrical device embodying the portion of FIG. 4.

The complete electrical device 40, including the cooling fins 24, is shown in FIG. 6. The heat sink member 22 has a threaded aperture 110 adapted for the attachment of an electrical lead to the semiconductor assembly 42.

The following example is illustrative of the teachings of this invention:

Three heat sink members comprising copper containing about 0.5% tellurium (available as Cabra No. 145) and measuring 2½ inches long and 1⅞ inches in diameter and the other two measuring 2⅛ inches in length and 1⅞ inches in diameter were prepared.

One heat sink member was processed in accordance with the teachings of a prior art invention filed Apr. 3, 1964, now U.S. Patent 3,277,957, and assigned to the same assignee as this invention, to produce a heat transfer apparatus for an electronic component.

The other two heat sink members were processed in accordance with the teachings of this invention except that the fin configuration was different in each case. The heat sink members were machined to the configuration shown in FIG. 2. The depth from the top of the member to the pedestal upon which the malleable metal member was mounted was 0.5 inch.

A steel weld ring was positioned and mounted on the top surface of each of the two heat sink members by a silver braze material and a brazing operation. A steel inner case was resistance welded to the steel weld ring. The heat sink members were then inverted and the cooling fins assembled to each member.

Twenty-four cooling fins were prepared from copper sheet .0485 inch in thickness. The fins measured 4 x 5 inches. Twelve fins were prepared with the same configuration of the fin 26 shown in FIG. 3. The other twelve fins were the same as the first twelve fins except no spoilers 32 were provided. The fins were prepared by cutting to size, punching the center hole and required spoilers, forming a collar about the center hole to provide about an 8 mil interference fit between each fin and the heat sink member. Each fin was then tin plated.

The fins were mounted with the first fin's smooth surface abutting the weld ring and the smooth surface of each additional fin abutting the bottom surface of the collar of each fin. The fins containing the apertures and the spoilers were assembled asymmetrically on the one heat sink member; that is, each adjoining fin configuration was rotated 180° from each other. Approximately 1500 pounds force was required to assemble each fin on the appropriate heat sink member. The finned heat sink members were then righted and the semiconductor device completed.

Each finned device was completed by first placing a steel hollow cylindrical member in the recess of the heat sink member. A layer of silver was then disposed within the inner case and positioned in the recess of the top surface of the pedestal portion of the massive metal member.

A silicon semiconductor thyristor element was prepared. The element consisted of two regions of n-type semiconductivity and two regions of p-type semiconductivity. An annular region of n-type semiconductivity was formed in the region of p-type semiconductivity.

The semiconductor element was affixed to a molybdenum electrical contact by alloying a layer of aluminum between the bottom surface of the element and the top surface of the contact. The element and the contact, each affixed to each other, were then disposed on the layer of silver within the recess of the pedestal.

To fabricate the multiple contact assembly, a hole was machined in the wall of a partially hollow connector. A steel coil spring was then disposed within the hollow connector.

A piece of polytetrafluoroethylene was machined to configuration shown in FIG. 4 to produce the electrically insulated plug. The lead, with the button-shaped electrical contact, which was disposed in the plug, was made of silver. The insulating jacket for the silver lead was made of polytetrafluoroethylene. The lead was formed to protrude out through the hole in the hollow connector.

The multiple electrical contact assembly was disposed on the semiconductor element within the inner case and the recess with the copper washer in electrical contact with the annular electrical contact of the element. The plug meanwhile projected through the washer placing the button-shaped contact of the electrical lead in contact with the centrally disposed electrical contact disc of the semiconductor element.

An apertured metal thrust washer and an apertured mica washer were each placed about the hollow connector on the copper washer. A second steel apertured thrust washer was placed on top of the mica washer. Three steel apertured spring washers and a third steel apertured thrust washer were each disposed in turn on the second steel apertured thrust washer.

A force was applied to the uppermost metal apertured thrust washer to force all the components together into an electrical and thermal conductive relationship. The force was calculated to produce a 1000 pound load on the surface of the semiconductor element.

When the desired force reading was reached, an apertured threaded plug was screwed down within the inner case until sufficient contact was obtained between the plug and the uppermost steel apertured thrust member to retain the desired force reading.

The devices were completed by hermetically sealing each semiconductor element within a header assembly welded to the weld ring. Each device was then painted with an epoxy black paint and baked 30 minutes at 150° C.

All three were then placed in electrical test circuits for evaluation. At an approach velocity of 800 feet per minute the thermal impedance of the heat sink member from the top of the pedestal to the ambient temperature of the coolant fluid for the prior art device was found to be 0.1862° C. per watt, for the new device with fins without spoilers it was 0.1803° C. per watt, and for the new device with fins containing spoilers and apertures it was 0.1485° C. per watt. At an approach velocity of 1200 feet per minute the respective values obtained were 0.1585° C. per watt, 0.1528° C. per watt and 0.1198° C. per watt. At an approach velocity of 1600 feet per minute the respective values obtained were 0.1409° C. per watt, 0.1377° C. per watt and 0.1067° C. per watt.

Additionally, it was found that the prior art device which had a current rating of 250 amperes now could be rated at 300 amperes with the new heat sink members and new cooling fin configuration.

We claim as our invention:

1. Apparatus for the removal of heat from a heat generating component comprising:

(1) a first electrically and thermally conductive member having first and second surfaces substantially parallel to each other and a peripheral side surface extending from said first surface to said second surface in a generally perpendicular direction with respect to said first surface;

(2) walls of said first member defining a first aperture adapted to receive a semiconductor device therein, said walls extending from said first surface toward said second surface a predetermined distance less than the distance between said first and said second surfaces;

(3) walls of said first member defining a second aperture, said walls extending from said second surface toward said first surface a predetermined distance less than the distance between said first and said second surfaces, said walls having a threaded surface to engage a threaded member within said aperture;

(4) the sum of the predetermined distances that each of said walls extends into said first member is less than the total distance between said first and said second surfaces;

(5) a plurality of spaced thermally conductive fins in a thermally conductive relationship with said first member, each of said fins being disposed around, and in an interference fit with, said first member; and (6) a plurality of integral tabs formed in each fin, each of said tabs being a deformed portion of said fin caused to project above the plane of said fin to provide walls defining an aperture extending through the fin.

2. The apparatus of claim 1 wherein:

each fin has an integral deformed portion extending above the plane of said fin and having walls defining an aperture substantially conforming to the side surface of said first member, the entire inner peripheral surface of said walls defining said aperture contacting said first member in said interference fit, said integral walls maintaining, in part, the spaced relationship between each adjacent pair of fins.

3. The apparatus of claim 2 wherein:

each fin is mounted on said first electrically and thermally conductive member asymmetrical to each adjoining fin.

4. An electrical device comprising:

(a) a first electrically and thermally conductive member having first and second surfaces substantially parallel to each other and a peripheral side surface extending from said first surface to said second surface in a generally perpendicular direction with respect to said first surface;

(b) walls of said first member defining a first aperture adapted to receive a semiconductor device therein, said walls extending from said first surface toward said second surface a predetermined distance less than the distance between said first and said second surfaces;

(c) walls of said first member defining a second aperture, said walls extending from said second surface toward said first surface a predetermined distance less than the distance between said first and said second surfaces, said walls having a threaded surface to engage a threaded member within said aperture;

(d) the sum of the predetermined distances that each of said walls extends into said first member is less than the total distance between said first and said second surfaces;

(e) a plurality of spaced thermally conductive fins in a thermally conductive relationship with said first member, each of said fins being disposed around, and in an interference fit with, said first member; and (f) a plurality of integral tabs formed in each fin, each of said tabs being a deformed portion of said fin caused to project above the plane of said fin to provide walls defining an aperture extending through the fin;

an electrically conductive member disposed within and mounted on a bottom surface of said first aperture; and a semiconductor device mounted on said electrically conductive member.

5. The device of claim 4 in which:

each of said fins is mounted on said first electrically and thermally conductive member asymmetrical to each adjoining fin;

and including:

an enclosure mounted on said first surface hermetically sealing said semiconductor device within said first aperture.

References Cited

UNITED STATES PATENTS

| | | | |
|---|---|---|---|
| 1,966,559 | 7/1934 | Olson | 165—182 |
| 2,063,736 | 12/1936 | Hardiman et al. | 165—183 |
| 2,428,145 | 9/1947 | Cook | 165—182 |
| 3,277,957 | 10/1966 | New et al. | 165—182 |

ROBERT A. O'LEARY, Primary Examiner

C. SUKALO, Assistant Examiner

U.S. Cl. X.R.

164—185